(12) United States Patent
Furuta (10) Patent No.: US 10,424,690 B2
(45) Date of Patent: Sep. 24, 2019

(54) SEMICONDUCTOR DEVICE, PRINT HEAD AND IMAGE FORMING APPARATUS

(71) Applicant: Oki Data Corporation, Tokyo (JP)

(72) Inventor: Hironori Furuta, Tokyo (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 16/157,405

(22) Filed: Oct. 11, 2018

(65) Prior Publication Data
US 2019/0115491 A1 Apr. 18, 2019

(30) Foreign Application Priority Data
Oct. 16, 2017 (JP) .................... 2017-200420

(51) Int. Cl.
- G03G 15/04 (2006.01)
- H01L 33/00 (2010.01)
- H01L 25/075 (2006.01)
- H01L 33/62 (2010.01)

(52) U.S. Cl.
CPC ... *H01L 33/0016* (2013.01); *G03G 15/04036* (2013.01); *H01L 25/0753* (2013.01); *H01L 33/0079* (2013.01); *H01L 33/62* (2013.01); *H01L 2933/0066* (2013.01)

(58) Field of Classification Search
CPC . H01L 33/0016; H01L 33/62; H01L 33/0079; H01L 2933/0066; G03G 15/04036
See application file for complete search history.

(56) References Cited

U.S. PATENT DOCUMENTS

| 8,497,893 B2 * | 7/2013 | Furuta | B41J 2/451 |
| | | | 257/88 |
| 2007/0075330 A1 * | 4/2007 | Ogihara | B41J 2/45 |
| | | | 257/134 |

FOREIGN PATENT DOCUMENTS

| JP | 2011018837 A | 1/2011 |
| JP | 4871978 A | 2/2012 |

* cited by examiner

*Primary Examiner* — Hoang X Ngo
(74) *Attorney, Agent, or Firm* — Muncy, Geissler, Olds & Lowe, P.C.

(57) ABSTRACT

A semiconductor device includes a first three-terminal light emitting element, a second three-terminal light emitting element that is disposed at a prescribed distance away from the first three-terminal light emitting element in a first direction, a first current supply electrode that corresponds to the first three-terminal light emitting element, a second current supply electrode that corresponds to the second three-terminal light emitting element, a first control electrode that corresponds to the first three-terminal light emitting element, a second control electrode that corresponds to the second three-terminal light emitting element, and a current extraction electrode that corresponds to the first three-terminal light emitting element and the second three-terminal light emitting element, wherein the first control electrode and the second control electrode are disposed at an inter-region that is determined between the first three-terminal light emitting element and the second three-terminal light emitting element.

17 Claims, 7 Drawing Sheets

SEMICONDUCTOR DEVICE, PRINT HEAD AND IMAGE FORMING APPARATUS

TECHNICAL FIELD

This invention relates to a semiconductor device, a print head, and an image forming apparatus that can preferably be applied to an electrophotographic printer (hereafter simply called a printer) for example.

BACKGROUND

Widely prevalent as a conventional printer is one that prints an image by forming an electrostatic latent image on the surface of a photosensitive drum by selectively irradiating it with light from a print head having multiple light emitting elements such as LEDs (Light Emitting Diodes) and light emitting thyristers disposed in alignment in an exposure device and developing a toner image by having a toner adhere to this electrostatic latent image. In the exposure device among them, multiple light emitting element chips or the like provided with multiple light emitting elements and multiple drive circuits that each drive the individual light emitting elements are attached in alignment along the main scanning direction on a prescribed circuit board.

Formed on the surface of the light emitting element chip is a terminal pad that is electrically connected to the above-mentioned light emitting elements and drive circuits. This light emitting element chip has this terminal pad and a terminal pad installed on the surface of the circuit board electrically connected through wire bonding or the like, thereby receiving a drive current, control signals, etc. from the circuit board to have the individual light emitting elements emit light.

As such a light emitting element chip, there is one that disposes an anode electrode and a gate electrode sandwiching a light emitting thyrister along the sub scanning direction perpendicular to the main scanning direction (see Patent Document 1 for example).

RELATED ART

Patent Document(s)

[Patent Doc. 1] JP Patent No. 4871978

However, in such a print head, because a gate electrode corresponding to a light emitting thyrister is disposed opposing the light emitting thyrister in the sub scanning direction, it was difficult to miniaturize the width in the sub scanning direction of the light emitting element chip.

This invention has been made considering the above point and proposes a semiconductor device, a print head, and an image forming apparatus that can be miniaturized.

SUMMARY

A semiconductor device disclosed in the application includes a first three-terminal light emitting element, a second three-terminal light emitting element that is disposed at a prescribed distance away from the first three-terminal light emitting element in a first direction, a first current supply electrode that corresponds to the first three-terminal light emitting element, a second current supply electrode that corresponds to the second three-terminal light emitting element, a first control electrode that corresponds to the first three-terminal light emitting element, a second control electrode that corresponds to the second three-terminal light emitting element, and a current extraction electrode that corresponds to the first three-terminal light emitting element and the second three-terminal light emitting element, wherein the first control electrode and the second control electrode are disposed at an inter-region that is determined between the first three-terminal light emitting element and the second three-terminal light emitting element.

A print head disclosed in the application includes multiple of the semiconductor devices discussed above and a substrate to which multiple of the semiconductor devices are attached in a state where the semiconductor devices are arranged along the first direction.

An image forming apparatus disclosed in the application includes an image forming part that generates an electrostatic latent image by exposing a photosensitive body by the print head discussed above and forms an image based on the electrostatic latent image with a developer, and a fuser part that fuses the image to a prescribed medium.

With embodiments disclosed in the application, the first control electrode and the second control electrode are disposed together with the first three-terminal light emitting element and the second three-terminal light emitting element along the main scanning direction. Thereby, the positions of the first control electrode and the second control electrode in the sub scanning direction match with those of the first three-terminal light emitting element and the second three-terminal light emitting element.

This invention allows realizing a semiconductor device, a print head, and an image forming apparatus that can be miniaturized.

BRIEF DESCRIPTION OF THE DRAWINGS

FIGS. 10A and 10B show the configuration of a light emitting element chip by the third embodiment, where

DETAILED DESCRIPTIONS OF PREFERRED EMBODIMENT(S)

Below, embodiments of this invention are explained referring to drawings.

1. First Embodiment

[1-1. Configuration of the Image Forming Apparatus]

Figure 1:
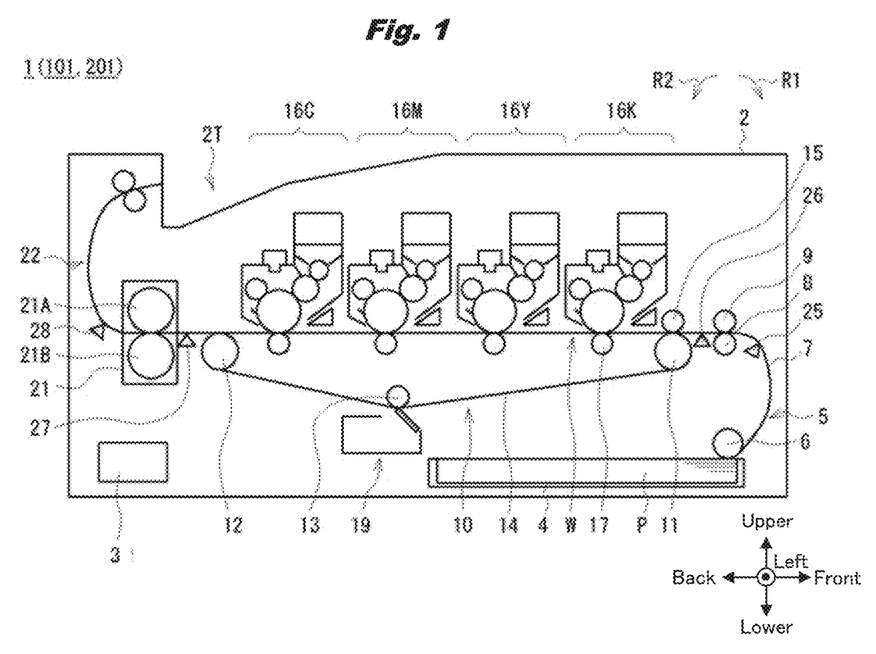
FIG. 1 is a diagram showing the overall configuration of an image forming apparatus.

As shown in FIG. 1, an image forming apparatus 1 by the first embodiment is so-called an MFP (Multi-Function Peripheral) and has functions such as one as an image scanner to read an image and a communication function other than a printer function to form (that is, print) an image on a sheet as a medium. Therefore, this image forming apparatus 1 operates as a printer, a copier, a facsimile machine, etc. by combining these functions. When functioning as a printer, this image forming apparatus 1 prints a desired color image on a sheet P of A3 or A4 in size for example. The image forming apparatus 1 has various kinds of parts disposed inside a printer chassis 2 formed in a box shape. Incidentally, explanations hereafter are given by regarding the right end part in FIG. 1 as the front face of the image forming apparatus 1 and defining the up-down direction, the right-left direction, and the front-back direction viewed opposing this front face. The image forming apparatus 1 controls the whole in an integrated manner by a control part 3. This control part 3 is connected with a host device (not shown) such as a computer device wirelessly or in a wired manner. Once image data expressing a print target image are given, and printing of the image data is instructed from this host device, the control part 3 executes a print process to form a printed image on the surface of the sheet P.

Installed in the lowest part inside the printer chassis 2 is a sheet accommodation cassette 4 that accommodates the sheet P. Installed in the upper front of the sheet accommodation cassette 4 is a sheet feeding part 5. The sheet feeding part 5 is configured of a hopping roller 6 disposed on the front upper side of the sheet accommodation cassette 4, a carrying guide 7 that guides the sheet P upwards along a carrying path W, a registration roller 8 and a pinch roller 9 opposing each other through the carrying path W, etc. By rotating the individual rollers as appropriate based on the control of the control part 3, the sheet feeding part 5 separates and picks up one piece at a time of the sheet P accommodated stacked in the sheet accommodation cassette 4, lets it proceed toward the upper front along the carrying path W by the carrying guide 7, turn toward the upper back in due course, and contact with the registration roller 8 and the pinch roller 9. The registration roller has its rotation appropriately suppressed, applies a frictional force to the sheet P between it and the pinch roller 9, thereby correcting so-called skew that the side edges of the sheet P become inclined relative to the process direction and setting it into a state where its leading and trailing edges trace the right and left guides, and then sends it toward the back.

In the back side of the registration roller 8 and the pinch roller 9, the carrying path W is formed approximately along the front-back direction, and a middle carrying part 10 is disposed in its lower side. The middle carrying part 10 has a configuration that a carrying belt 14 made of an endless belt is stretched around a front roller 11 disposed in the front side, a back roller 12 disposed in the back side, and a lower roller 13 disposed in the lower side. Also, installed in the upper side of the front roller 11 is an adsorption roller 15 in a position opposing it through the carrying belt 14. Once a drive force is transmitted from a prescribed belt drive motor (not shown) to the back roller 12, this middle carrying part 10 rotates this back roller 12 in the direction of an arrow R2 to run the carrying belt 14. Thereby, the carrying belt 14 runs the upper part along the carrying path W, that is the part stretched between the front roller 11 and the back roller 12, toward the back. At this time, once the sheet P is handed over from the sheet feeding part 5, the middle carrying part 10 holds this between the adsorption roller 15 and the front roller 11 together with the carrying belt 14, and lets the sheet P proceed toward the back along with the running of the carrying belt 14 in a state where the sheet P is placed on the upper side of the carrying belt 14.

In the upper side of the middle carrying part 10, opposing the middle carrying part 10 through the carrying path W, four image forming units 16C, 16M, 16Y, and 16K are disposed sequentially from the back side toward the front side. Although the image forming units 16C, 16M, 16Y, and 16K (hereafter, also collectively called the image forming unit 16) each correspond to cyan (C), magenta (M), yellow (Y), and black (K) colors, they are configured in the same manner with only the colors being different.

Figure 2:
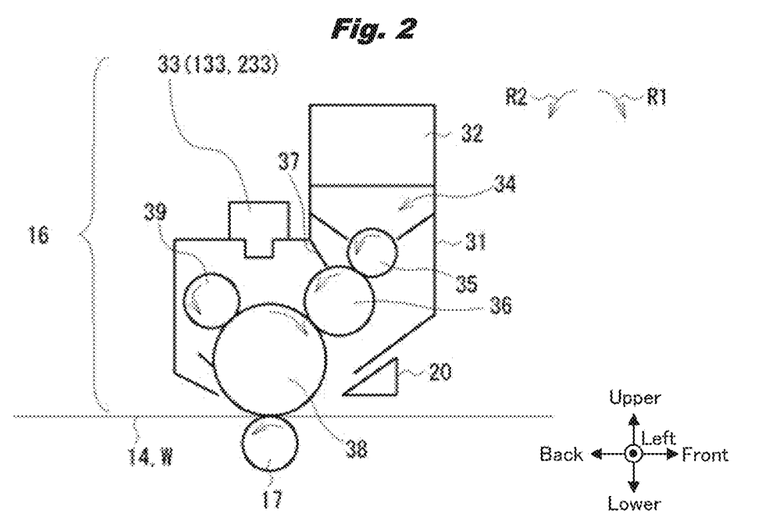
FIG. 2 is a diagram showing the configuration of an image forming unit.

As its schematic side view is shown in FIG. 2, the image forming unit 16 is configured of an image forming part 31, a toner cartridge 32, and a print head 33, and sandwiches the carrying belt 14 between it and a transfer roller 17 disposed below it. Incidentally, the image forming unit 16 and parts constituting it have sufficient length in the right-left direction according to the right-left direction length of the sheet P. Therefore, many parts have a greater right-left direction length than the front-back and up-down direction lengths, formed in an elongated shape along the right-left direction.

The toner cartridge 32 contains a toner as a developer, and is disposed in the upper side of the image forming part 31 and attached above the image forming part 31. This toner cartridge 32 supplies the contained toner to a toner accommodation part 34 of the image forming part 31. In the image forming part 31, other than the toner accommodation part 34, a supply roller 35, a development roller 36, a regulating blade 37, a photosensitive drum 38, and a charging roller 39 are incorporated.

The supply roller 35 is formed in a columnar shape with its central axis along the right-left direction, and an elastic layer made of a conductive urethane rubber foam or the like is formed on its circumferential face. The development roller 36 is formed in a columnar shape with its central axis along the right-left direction, and an elastic layer having elasticity, a surface layer having conductivity, etc. are formed on its circumferential face. The regulating blade 37 is made of a stainless steel plate of a prescribed thickness for example, and has part of it in contact with the circumferential face of the development roller 36 in a slightly elastically deformed state. The photosensitive drum 38 is formed in a columnar shape with its central axis along the right-left direction, and a charge generation layer and a charge transportation layer in a thin film shape are formed sequentially on its circumferential face, enabling it to be charged. The charging roller 39 is formed in a columnar shape with its central axis along the right-left direction, its circumferential face is coated with a conductive elastic body, and this circumferential face is in contact with the circumferential face of the photosensitive drum 38.

Also, in a position that is in the lower front side of the image forming part 31 and in the upstream side of a contact place between the photosensitive drum 38 and the carrying belt 14, a destaticizing light source 20 is installed. This destaticizing light source 20 radiates prescribed light onto the photosensitive drum 38, thereby eliminating static electricity charging it.

By a drive force supplied from an unshown drum motor, this image forming part 31 rotates the supply roller 35, the development roller 36, and the charging roller 39 in the direction of the arrow R2 (anticlockwise in the figure), and rotates the photosensitive drum 38 in the direction of an arrow R1 (clockwise in the figure). Furthermore, the image forming part 31 charges the supply roller 35, the development roller 36, the regulating blade 37, and the charging roller 39 by applying their respectively prescribed bias voltages.

With its charge, the supply roller 35 lets the toner inside the toner accommodation part 34 adhere to its circumferential face and rotates to let this toner adhere to the circumferential face of the development roller 36. After excess toner has been removed from the circumferential face by the regulating blade 37, the development roller 36 lets this circumferential face contact with the circumferential face of the photosensitive drum 38. On the other hand, the charging roller 39 uniformly charges the circumferential face of the photosensitive drum 38 by contacting with the photosensitive drum 38 in a charged state. The print head 33 has multiple light emitting element chips 42 arranged linearly along the right-left direction (the details are mentioned below), and emits light at every prescribed time interval in a light emission pattern based on image data signals supplied from the control part 3 (FIG. 1), thereby exposing the photosensitive drum 38. Thereby, the photosensitive drum 38 has an electrostatic latent image formed on its circumferential face in its upper end vicinity. Subsequently, the photosensitive drum 38 rotates in the direction of the arrow R1 to bring the part with this electrostatic latent image formed into contact with the development roller 36. Thereby, the toner adheres to the circumferential face of the photosensitive drum 38 based on the electrostatic latent image, developing a toner image based on the image data.

The transfer roller 17 is positioned immediately under the photosensitive drum 38, and sandwiches the upper part of the carrying belt 14 between the upper end vicinity on its circumferential face and the lower end vicinity of the photosensitive drum 38. To this transfer roller 17, a prescribed bias voltage is applied, and also a drive force is supplied from an unshown drum motor to rotate it in the direction of the arrow R2. Thereby, if the sheet P has been carried along the carrying path W, the image forming unit 16 transfers the toner image developed on the circumferential face of the photosensitive drum 38 to this sheet P.

In this manner, the image forming units 16 sequentially transfer and superimpose toner images of their respective colors onto the sheet P carried up from the front along the carrying path W, and let it proceed toward the back.

Also, under the lower roller 13 in the middle carrying part 10 (FIG. 1), a cleaning part 19 is installed. The cleaning part 19 cleans by scraping down from the surface of the carrying belt 14 any toner adhering to the carrying belt 14 due to a carrying failure of the sheet P etc. when an image forming process is performed. Thereby, the middle carrying part 10 prevents so-called bleedthrough that a toner adheres to the back face, that is a face oriented downwards in the carrying path W and is a face to which no toner image is transferred, of the sheet P carried up next.

In the back end vicinity of the middle carrying part 10, a fuser part 21 is installed. The fuser part 21 is configured of a heat application roller 21A and a pressure application roller 21B disposed opposing each other through the carrying path W. The heat application roller 21A is formed in a cylindrical shape with its central axis oriented in the right-left direction, and a heater is installed inside. The pressure application roller 21B is formed in the same cylindrical shape as the heat application roller 21A, and presses its upper surface against the lower surface of the heat application roller 21A with a prescribed pressure. Based on the control of the control part 3, this fuser part 21 heats the heat application roller 21A and rotates the heat application roller 21A and the pressure application roller 21B in their respectively prescribed direction. Thereby, the fuser part 21 applies heat and a pressure to the sheet P received from the middle carrying part 10, that is, the sheet P to which the four-color toner images are transferred superimposed, to fuse the toners, and further hands it over toward the back.

Toward the back of the fuser part 21, a sheet ejection part 22 is disposed. In the same manner as the sheet feeding part 5, the sheet ejection part 22 is configured of a combination of guides that guide the sheet P, multiple carrying rollers, etc. This sheet ejection part 22 rotates the individual carrying rollers as appropriate according to the control of the control part 3, thereby carrying the sheet P handed over from the fuser part 21 toward the upper back, then turning it toward the front, and ejecting it to an ejection tray 2T formed on the upper face of the printer chassis 2.

Furthermore, in multiple places along the carrying path W inside the printer chassis 2, sheet sensors 25, 26, 27, and 28 for detecting the sheet P are installed as appropriate. These sheet sensors 25 etc. each detect the presence/absence of the sheet P in the carrying path W and notify the control part 3 of the obtained detection results. Accordingly, the control part 3 controls the rotation of the carrying rollers and the running of the carrying belt 14 in the middle carrying part 10 as appropriate.

[1-2. Configuration of the Print Head]

Figure 3:
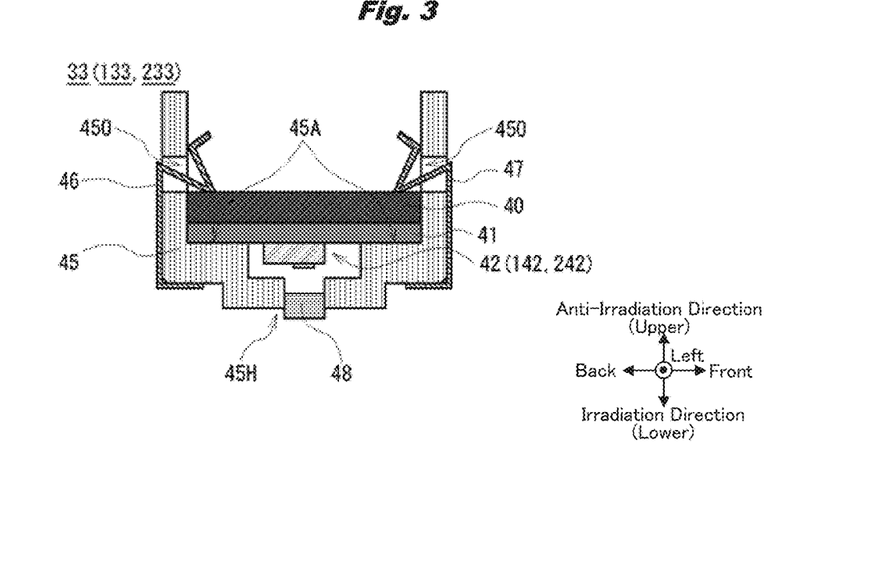
FIG. 3 is a diagram showing the configuration of a print head.

Next, the configuration of the print head 33 is explained referring to FIG. 3. Shown in FIG. 3 is a schematic cross-sectional view of the print head 33. Hereafter, the downward direction in FIG. 3 is also called the irradiation direction, and the upward direction is also called the anti-irradiation direction.

The print head 33 as an optical print head is configured centering on a base member 40. The base member 40 is injection-molded using an organic macromolecular material etc., is formed in a flat rectangular parallelepiped shape or a plate shape overall, being shorter in the front-back direction than in the right-left direction and even shorter in the up-down direction, and has sufficient strength. On the irradiation direction side (that is, lower side) of the base member 40, a printed wiring board 41 is installed. Compared with the base member 40, the printed wiring board 41 has almost the same lengths in the right-left and front-right directions and is somewhat shorter in the up-down direction, that is, thinner. This printed wiring board 41 is made of a glass epoxy resin for example, and prescribed circuit patterns are each formed on its upper and lower surfaces.

Figure 4:
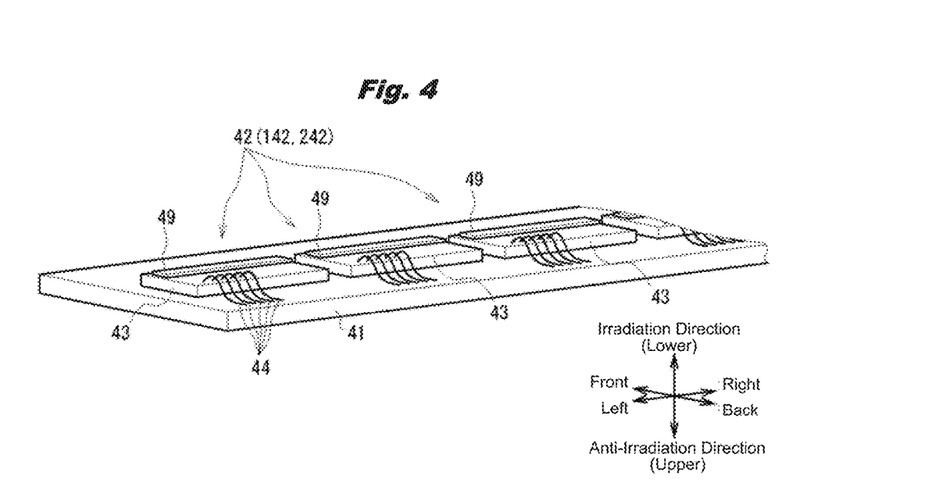
FIG. 4 is a perspective view showing the configuration of a printed wiring board and light emitting element chips.

On the irradiation direction side of the printed wiring board 41, as a perspective view is shown in FIG. 4, light emitting element chips 42 in a large number such as 26 are attached by so-called the die bonding technology in a state where they are aligned in a row along the right-left direction (hereafter, this is also called the main scanning direction dm). The light emitting element chip 42 is made by attaching an epitaxial film 49, that is thin and elongated in the right-left direction and is short in the up-down direction (that is, thin), to the irradiation direction side (that is, lower side) surface of an IC board 43 configured in a plate shape.

The epitaxial film 49 has light emitting thyristers in a large number such as 192 formed in a state where they are aligned along the right-left direction. This epitaxial film 49 is electrically connected to the IC board 43 by being bonded to the surface of the IC board 43 by the epitaxial film bonding method disclosed in Japanese Unexamined Patent Application 2011-233590 for example, and afterwards having its installed connecting terminals wired mutually using the photolithographic method.

Also, on the irradiation direction side of the printed wiring board 41, in the back side of each light emitting element chip 42, driver ICs (Integrated Circuits) (not shown) in a large number such as 26 are attached in a state where they are aligned in a row along the right-left direction. Installed on each driver IC as a drive circuit are, for example, 192 element drive parts that each drive 192 light emitting thyristers installed on the light emitting element chip 42. For the convenience of explanation, hereafter the 26 driver ICs (that is, drive circuits) are also collectively called the drive circuit group, and the light emitting thyrister is also called the driven elements.

In this way, the printed wiring board 41 has 26 light emitting element chips 42 installed, and each light emitting element chip 42 has 192 light emitting thyristers installed, therefore in total 4992 light emitting thyristers are installed. Also, the print head 33 (FIGS. 3 and 4) has almost the same right-left direction length as the length of the short side of the A4 size (210 mm), and over a range of this length 4992 light emitting thyristers are disposed with equal intervals (that is, the same pitch). Thereby, the print head 33 can generate an electrostatic latent image of 600 dpi in resolution on the circumferential face of the photosensitive drum 38 (FIG. 2). Also, installed on the irradiation direction side (that is, lower side) surface of each light emitting element chip 42 is a terminal pad that is electrically connected with the printed wiring board 41 through bonding wires 44.

Also, the print head 33 (FIG. 3) has the base member 40 and the printed wiring board 41 mentioned above attached to a holder 45. The holder 45 as a whole has a shape of a hollow quadrangular prism formed along the right-left direction having the anti-irradiation direction side face removed, and its cross section has a shape similar to the upper-case alphabet "U" with the anti-irradiation direction side open. Also, the holder 45 has an open part 450 drilled on the front and back side plates through which cramp members 46 and 47 penetrate.

Formed on the inner face in the irradiation direction side of the holder 45 is a support part 45A that supports the printed wiring board 41. When it is manufactured, the print head 33 has the printed wiring board 41 and the base member 40 in a superimposed state are inserted to the holder 45, and further the cramp members 46 and 47 are attached. The cramp members 46 and 47 are both made of metal, and with their elastic forces, fix through the base member 40 the printed wiring board 41 with its irradiation direction face in contact with the support part 45A of the holder 45. As a result, the positional relationship between the light emitting thyristers of the light emitting element chips 42 attached to the printed wiring board 41 and the holder 45.

Also, formed near the center of the irradiation direction side part of the holder 45 is a mounting hole 45H that is made of an elongated hole along the right-left direction and penetrates in the up-down direction, and a rod lens array 48 is mounted to this mounting hole 45H. The rod lens array 48 has a configuration where multiple microlenses with their optical axes aligned with the up-down direction are arranged along the right-left direction, and they are fixed in a state where their positions are adjusted so that the focal point of each lens matches with each light emitting thyrister of the light emitting element chip 42.

[1-3. Configuration of the Light Emitting Element Chip]

[1-3-1. Overall Configuration of the Light Emitting Element Chip]

Figure 5:
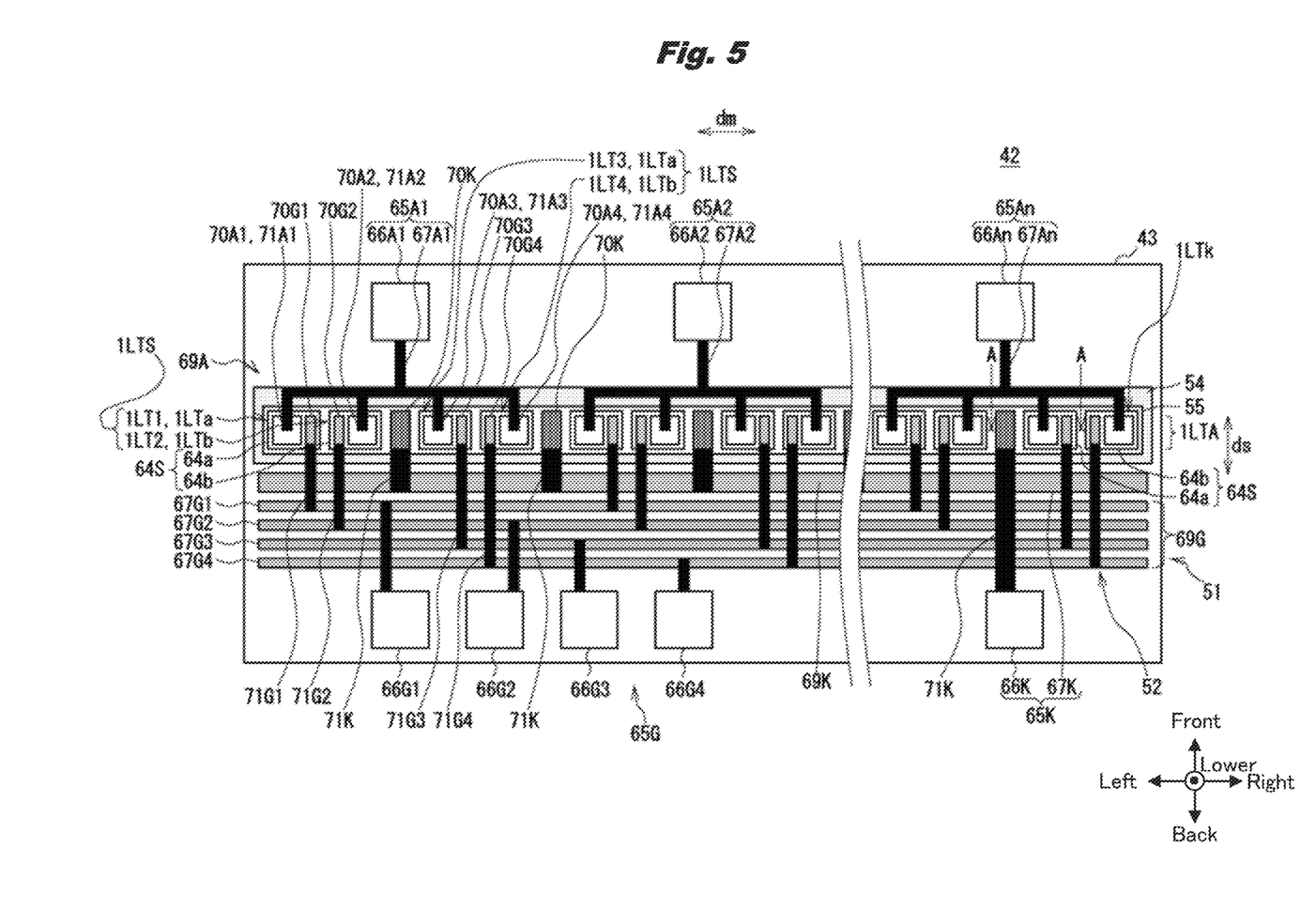
FIG. 5 is a bottom view showing the configuration (1) of a light emitting element chip by the first embodiment.

As shown in FIG. 5, the light emitting element chip 42 as a semiconductor device is connected to an unshown driver IC, and light emitting thyristers 1LT disposed in an approximate line are driven based on control signals sent from the driver IC. This light emitting element chip 42 has an IC (Integrated Circuit) board 43, a light emitting thyrister array 1LTA that is installed on the IC board 43 and comprises multiple light emitting thyristers 1LT as three-terminal light emitting elements, a common wiring part 51 that drives the multiple light emitting thyristers 1LT, and a lead-out wiring part 52 that connects the multiple light emitting thyristers 1LT and the common wiring part 51.

[1-3-2. Configuration of the IC Board]

The IC board 43 is formed of Si substrate, SIC board, GaN substrate, glass, plastic, or the like, and supports the multiple light emitting thyristers 1LT, the coming wiring part 51, and the lead-out wiring part 52. Also, the IC board 43 prevents conduction with the light emitting thyristers 1LT by forming a flattening film 54 made of a highly flat insulating film in places where the light emitting thyristers 1LT are installed. On the flattening film 54, a semiconductive thin film 55 is bonded. On the semiconductive thin film 55, a light emitting thyrister array 1LTA is formed.

[1-3-3. Configuration of the Light Emitting Thyrister Array]

The light emitting thyrister array 1LTA is a three-terminal light emitting element array formed in an epitaxial film 49 (FIG. 4) and is installed on the flattened film 54 formed on the IC board 43. Also, the light emitting thyrister array 1LTA is configured of an unshown bonding layer, and multiple light emitting thyristers 1LT1, 1LT2, . . . , 1LTk (k=4n pieces) (hereafter, these are also collectively called the light emitting thyrister 1LT) arranged in an approximate line along the main scanning direction dm that is the longer direction of the IC board 43. These light emitting thyristers 1LT are configured having light emitting thyrister pairs 1LTS, each of which consists of adjacent odd-numbered and even-numbered light emitting thyristers such as 1LT1 and 1LT2. Hereafter, the light emitting thyristers 1LT positioned on the left side, that is one side of the main scanning direction dm, in the light emitting thyrister pairs 1LTS (that is, the light emitting thyristers 1LT1, 1LT3, 1LT5, . . . ) are also called the in-pair first light emitting thyristers 1LTa, and the light emitting thyristers 1LT positioned on the right side, that is the other side in the main scanning direction dm, in the light emitting thyrister pairs 1LTS (that is, the light emitting thyristers 1LT2, 1LT4, 1LT6, . . . ) are also called the in-pair second light emitting thyristers 1LTb.

Figure 6:
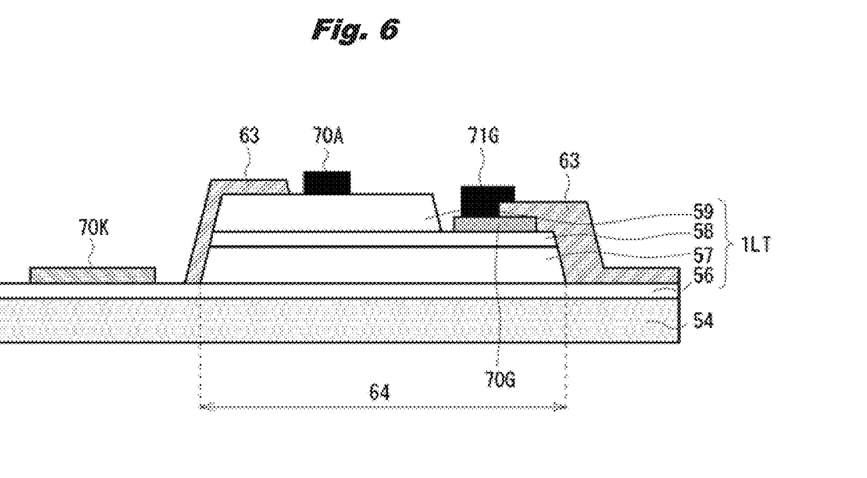
FIG. 6 shows the configuration (2) of the light emitting element chip by the first embodiment, which is an arrow direction cross-sectional view A-A in FIG. 5.

The light emitting thyrister 1LT is a light emitting element formed by etching the epitaxial film 49 (FIG. 4) bonded with the flattening film 54 through an unshown bonding layer, and as shown in FIG. 6, is formed by epitaxially growing a prescribed buffer layer or sacrificial layer (not shown) on a GaAs wafer substrate, and afterwards making a laminated structure where an N-type layer 56 as a common layer containing an N-type impurity, a P-type layer 57 formed containing a P-type impurity, an N-type layer 58 as a control electrode formation layer containing an N-type impurity, and a P-type layer 59 as a current supply electrode formation layer formed containing a P-type impurity are sequentially stacked. In this manner, the light emitting thyrister 1LT is configured as a wafer having a four-layer structure of "PNPN" from the upper side. Also, the N-type layer 56 in all the light emitting thyrister 1LT is made one common layer.

Furthermore, the light emitting thyrister 1LT has a cathode electrode 70K on the N-type layer 56, a gate electrode 70G on the N-type layer 58, and an anode electrode 70A on the P-type layer 59 formed. In this manner, the light emitting thyrister 1LT is made a so-called N-gate type where a gate (G) is led out from the N-type layer 58. Furthermore, an insulating layer 63 is formed on the light emitting thyristor 1LT excluding part of the P-type layer 59, part of the gate electrode 70G, and the cathode electrode 70K.

Also, a gate electrode formation region 64 as a control electrode formation region, that is made of the P-type layer 57 and the N-type layer 58, has the gate electrode 70G formed, and is a unit to element-isolate the P-type layer 57 corresponding to one light emitting thyristor 1LT, has a rectangular shape that is long in the main scanning direction dm in the bottom view. As shown in FIG. 5, this gate electrode formation region 64 is configured as a gate electrode formation region pair 64S of two adjacent gate electrode formation regions 64 (in-pair first gate electrode formation region 64a and in-pair second gate electrode formation region 64b) corresponding to one light emitting thyristor pair 1LTS. Hereafter, the gate electrode formation region 64 positioned on the left side, that is one side in the main scanning direction dm, in one gate electrode formation region pair 64S is also called the in-pair first gate electrode formation region 64a, and the gate electrode formation region 64 positioned on the right side, that is the other side in the main scanning direction dm, in one gate electrode formation region pair 64S is also called the in-pair second gate electrode formation region 64b.

[1-3-4. Configuration of the Common Wiring Part]

As shown in FIG. 5, the common wiring part 51 is configured of anode common wiring parts 65A (65A1-65An), a gate common wiring part 65G, and a cathode common wiring part 65K.

The anode common wiring parts 65A (65A1-65An) are configured of anode pads 66A (66A1-66An) and anode common wirings 67A (67A1-67An). The anode pads 66A1-66An are disposed as n pieces along the main scanning direction dm on the IC board 43, connected with an external driver IC, and are supplied with signals to control four anode voltages of 4n pieces of light emitting thyristors 1LT arranged along the main scanning direction dm. The anode common wirings 67A1-67An are approximately T-shaped wirings in the bottom view face, and extend in the sub scanning direction ds as a second direction perpendicular to the main scanning direction dm from the anode pads 66A1-66An toward the light emitting thyristor array 1LTA side, and then along the main scanning direction dm.

The gate common wiring part 65G is disposed on the IC board 43 in the opposite side of the anode common wiring part 65A with respect to the light emitting thyristor array 1LTA, and is configured of four gate pads 66G1-66G4, and four gate common wirings 67G1-67G4 that extend from the gate pads 66G1-66G4 toward the light emitting thyristor array 1LTA in the sub scanning direction ds and then in the main scanning direction dm.

The cathode common wiring part 65K is disposed on the IC board 43 in the opposite side of the anode common wiring part 65A with respect to the light emitting thyristor array 1LTA, and is configured of one cathode pad 66K, and a cathode common wiring 67K that extends from the cathode pad 66K toward the light emitting thyristor array 1LTA in the sub scanning direction ds and then in the main scanning direction dm.

[1-3-5. Configuration of the Lead-Out Wiring Part]

The lead-out wiring part 52 is configured of an anode lead-out wiring part 69A, a gate lead-out wiring part 69G, and a cathode lead-out wiring part 69K, and is a wiring that connects the light emitting thyristors 1LT and the common wiring part 51 installed on the IC board 43.

The anode lead-out wiring part 69A is configured of the anode electrodes 70A (70A1-70A4) formed on the P-type layer 59 (FIG. 6) that is an anode region, and anode lead-out wirings 71A (71A1-71A4) that connect the anode electrodes 70A and the anode common wirings 67A1-67An. The anode electrode 70A is a layer made of an AlGaAs layer for example. The anode lead-out wirings 71A linearly extend along the sub scanning direction ds from the anode electrodes 70A toward the anode common wirings 67A1-67An, and are connected with the anode common wirings 67A1-67An. On the surfaces of the N-type layer 56, the P-type layer 57, the N-type layer 58, and the P-type layer 59 (FIG. 6) the insulating layer 63 is formed, thereby the anode lead-out wirings 71A would not contact with any other layer forming the light emitting thyristors 1LT.

The gate lead-out wiring part 69G is configured of gate electrodes 70G (70G1-70G4) formed on the N-type layer 58 that is a gate region, and gate lead-out wirings 71G (71G1-71G4) that extend linearly from the gate electrodes 70G toward the four gate common wirings 67G1-67G4 along the sub scanning direction ds and are connected with the gate common wirings 67G1-67G4. On the surfaces of the N-type layer 56, the cathode common wiring 67K, and the gate common wirings 67G1-67G4, an unshown insulating layer is formed, thereby the gate lead-out wiring 71G would not become short-circuited with the intersecting N-type layer 56, cathode common wiring 67K, or gate common wirings 67G1-67G4.

The cathode lead-out wiring part 69K is configured of the cathode electrode 70K formed on the N-type layer 56 that is a common layer for k pieces of the light emitting thyristors 1LT, and a cathode lead-out wiring 71K that extends linearly along the sub scanning direction ds from the cathode electrode 70K toward the cathode common wiring 67K and becomes connected with it. On the surfaces of the N-type layer 56, the cathode common wiring 67K, and the gate common wirings 67G1-67G4, an unshown insulating layer is formed, thereby the cathode lead-out wiring 71K would not become short-circuited with the intersecting N-type layer 56, cathode common wiring 67K, or gate common wirings 67G1-67G4 (FIG. 5).

In this manner, the cathode electrode 70K is formed on the N-type layer 56 that commonly connects the cathode electrode 70K of the light emitting thyristor 1LT1 and the cathode electrode 70K of the light emitting thyristor 1LT2, and the cathode lead-out wiring 71K extends toward the back that is one way in the sub scanning direction ds. Also, the gate electrode 70G is formed on the N-type layer 58 that overlaps with the N-type layer 56, and the gate lead-out wiring 71G extends toward the back. Furthermore, the anode electrode 70A is formed on the P-type layer 59 that overlaps with the N-type layer 58, and the anode lead-out wiring 71A extends toward the front that is the other direction of the sub scanning direction ds.

Here, the cathode electrode 70K is disposed between adjacent light emitting thyristor pairs 1LTS so as to have the same position in the sub scanning direction ds with of the light emitting thyristor pairs 1LTS and align with the light emitting thyristor pairs 1LTS in the main scanning direction dm. Also, the gate electrode 70G is disposed between adjacent in-pair first light emitting thyrister 1LTa and in-pair second light emitting thyrister 1LTb so as to have the same position in the sub scanning direction ds with the in-pair first light emitting thyrister 1LTa and the in-pair light emitting thyrister 1LTb and align with the in-pair first light emitting thyrister 1LTa and the in-pair light emitting thyrister 1LTb in the main scanning direction dm.

In other words, on the light emitting element chip 42, between the odd-numbered light emitting thyristor 1LT and the even-numbered light emitting thyristor 1LT from the end part of the main scanning direction dm, the gate electrodes 70G corresponding to the light emitting thyristors 1LT are disposed opposing each other along the main scanning direction dm, and the cathode electrode 70K is formed between the even-numbered light emitting thyristor 1LT and the odd-numbered light emitting thyristor 1LT.

Also, on the light emitting element chip 42, because more current flows in the cathode electrode 70K than in the gate electrode 70G, the width of the cathode electrode 70K in the main scanning direction dm is formed wider than that of the gate electrode 70G. Thereby, the light emitting element chip 42 prevents the cathode voltage from rising and keeps the cathode voltage constant from one end to the other end of the light emitting element chip 42 in the main scanning direction dm.

[1-3-6. Circuit Configuration of the Light Emitting Element Chip]

Figure 7:
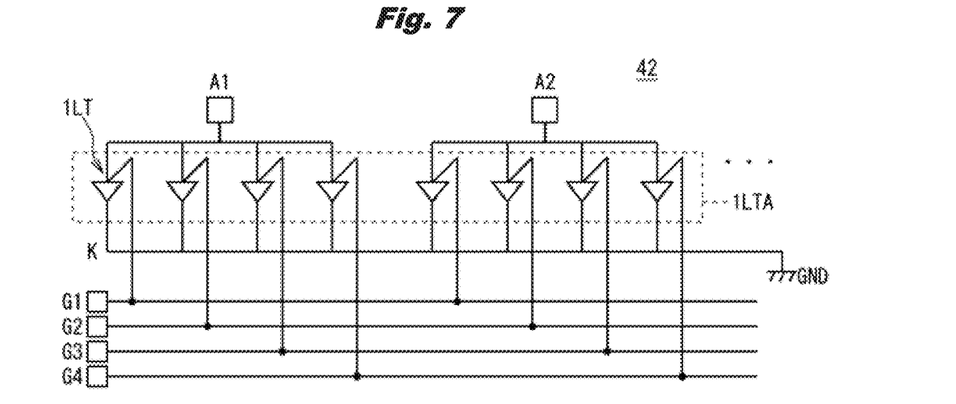
FIG. 7 is a circuit diagram showing the circuit configuration of the light emitting element chip.

As the circuit diagram of the light emitting element chip 42 is shown in FIG. 7, the light emitting element chip 42 has multiple light emitting thyristors 1LT disposed along the main scanning direction dm to form a light emitting thyristor array 1LTA. The light emitting thyristor 1LT has a similar configuration to a commonly-used light emitting diode (LED), and functions as so-called a light emitting element that emits light once a current is supplied. The light emitting thyristor 1LT has three terminals of anode (A), cathode (K), and gate (G). This light emitting thyristor 1LT is a three-terminal switch element having a control electrode (that is, a gate terminal) through which a threshold voltage or a threshold current can be controlled from the exterior. In other words, this gate terminal is a control terminal that accepts a control whether to let the light emitting thyristor 1LT emit light, that is, whether to drive it.

With such a configuration, if a prescribed power voltage is applied to the anode terminal, the cathode terminal potential becomes low, and the gate terminal potential becomes low, a trigger current flows between them, causing a current to flow between the anode terminal and the cathode terminal, and the light emitting thyristor 1LT enters a light emitting state. Also, in this light emitting state, if the anode terminal potential is lowered to the same level as the cathode terminal potential, eliminating their potential difference, the light emitting thyristor 1LT enters a lights-out state. Furthermore, if the gate terminal potential is high, even if a potential difference occurs between the anode terminal and the cathode terminal, no trigger current flows, therefore the light emitting thyristor 1LT does not enter the light emitting state but maintains the lights-out state.

The cathode terminals of the light emitting thyristors 1LT are all connected to a cathode wiring K, and the cathode wiring K is connected to a ground GND and is at a ground voltage. The anode terminals of the light emitting thyristors 1LT are grouped in four dots, and each group is connected to one of wire bonding pads A1, A2, . . . , An. The gate terminals of the light emitting thyristors 1LT of four dots are connected to different wire bonding pads G1, G2, G3, and G4. Here, the cathode wiring K in FIG. 7 corresponds to the cathode lead-out wiring 71K and the cathode common wiring 67K in FIG. 5, the wire bonding pads A1, A2, . . . , An in FIG. 7 correspond to the anode pads 66A1-66An in FIG. 5, and the wiring bonding pads G1, G2, G3, and G4 in FIG. 7 correspond to the gate pads 66G1-66G4 in FIG. 5, respectively.

With such a configuration, the light emitting element chip 42 selects a gate by setting a specific wire bonding pad G1, G2, G3, or G4 (that is, the gate terminal of the light emitting thyristor 1LT) to Low and the other wire bonding pads G1, G2, G3, and G4 (that is, gate terminals of the light emitting thyristor 1LT) to High, and applies a current from a specific wire bonding pad A1, A2, . . . , or An (that is, an anode terminal of the light emitting thyristor 1LT), thereby turning on a specific light emitting thyristor 1LT.

[1-4. Manufacturing Method of the Light Emitting Element Chip]

Figure 8A:
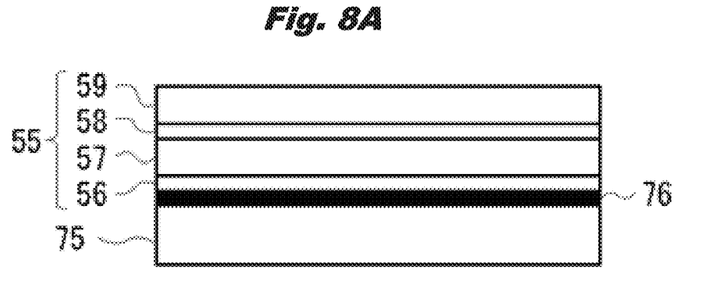
FIGS. 8A, 8B, and 8C are diagrams showing the manufacturing method of the light emitting element chip.

Next, the manufacturing method of the light emitting element chip 42 is explained. First, as shown in FIG. 8A, sequentially formed on a base substrate 75 by the metal organic chemical vapor deposition (MOCVD) method are the sacrificial layer 76, the N-type layer 56, the P-type layer 57, the N-type layer 58, and the P-type layer 59. The sacrificial layer 76 is a layer for peeling the N-type layer 56, the P-type layer 57, the N-type layer 58, the P-type layer 59, etc. accumulated above the sacrificial layer 76 off the base substrate 75. The N-type layer 56, the P-type layer 57, the N-type layer 58, and the P-type layer 59 are layers constituting the light emitting thyrister 1LT.

Figure 8B:
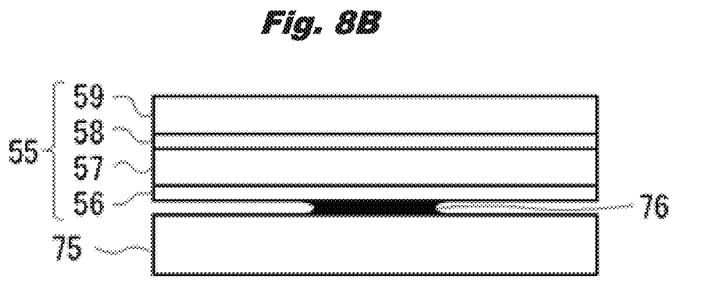
Figure 8C:
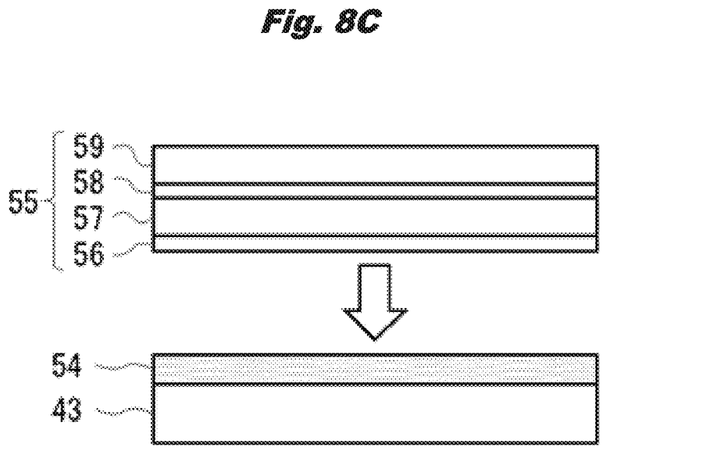

Next, as shown in FIG. 8B, the sacrificial layer 76 is selectively etched with a HF (hydrogen fluoride) solution. Thereby, the semiconductor thin film 55 consisting of the N-type layer 56, the P-type layer 57, the N-type layer 58, and the P-type layer 59 is peeled off the base substrate 75, and is washed with water so that no HF (hydrogen fluoride) solution remains. Next, as shown in FIG. 8C, the semiconductor thin film 55 is bonded by intermolecular forces to the flattening film 54 formed on the IC board 43.

Next, the semiconductor thin film 55 bonded to the IC board 43 is etched to form a shape as shown in FIG. 6, forming the light emitting thyristor array 1LTA (k=4n pieces of light emitting thyristors 1LT). Subsequently, as shown in FIG. 6, formed on the light emitting thyristor 1LT are the cathode electrode 70K, the gate electrode 70G, the anode electrode 70A, and the insulating layer 63. At this time, the cathode electrode 70K is formed on the N-type layer 56 and between adjacent light emitting thyristor pairs 1LTS, the gate electrode 70G is formed on the N-type layer 58 and between the P-type layer 59 of the in-pair first light emitting thyristor 1LTa and the P-type layer 59 of the in-pair second light emitting thyristor 1LTb, and the anode electrode 70A is formed on the P-type layer 59.

Furthermore, to light emitting thyristors 1LT, the cathode lead-out wirings 71K are formed so as to connect the cathode electrode 70K and the cathode common wiring 67K, the gate lead-out wirings 71G are formed so as to connect the gate electrodes 70G and the gate common wirings 67G1-67G4, and the anode lead-out wirings 71A are formed so as to connect the anode electrodes 70A and the anode common wirings 67A1-67An.

Also, as shown in FIG. 5, no cathode electrode 70K is formed outside the light emitting thyristors 1LT at both ends in the main scanning direction dm of the light emitting element chip 42. Therefore, the light emitting thyristors 1LT at both ends in the main scanning direction of the light emitting element chip 42 have a larger distance to the cathode electrode 70K than the other light emitting thyristors 1LT, therefore the cathode voltage tends to rise. To cope with this, the light emitting element chip 42 has its N-type layer 56 formed sufficiently thick so that the voltage rise of the cathodes of the light emitting thyristors 1LT at both ends in the main scanning direction dm of the light emitting element chip 42 is contained within a set value.

[1-5. Operations and Effects]

In the above-mentioned configuration, the light emitting element chip 42 disposes the gate electrode 70G1 and the gate electrode 70G2 between the light emitting thyrister 1LT1 and the light emitting thyrister 1LT2 adjacent to the light emitting thyrister 1LT1 in the main scanning direction dm so as to be adjacent to and oppose the light emitting thyrister 1LT1 and the light emitting thyrister 1LT2 along the main scanning direction dm. Also, the light emitting element chip 42 disposes the cathode electrode 70K between the light emitting thyrister 1LT2 and the light emitting thyrister 1LT3 aligned with the light emitting thyrister 1LT2 and the light emitting thyrister 1LT3 in the main scanning direction dm.

Therefore, the light emitting element chip 42 can match the positions of the gate electrodes 70G1 and 70G2, and the cathode electrode 70K in the sub scanning direction ds with those of the light emitting thyristers 1LT1, 1LT2, and 1LT3. Thereby, the light emitting element chip 42 can make the region occupied by the light emitting thyrister array 1LTA in the sub scanning direction narrower, therefore the width of the light emitting element chip 42 in the sub scanning direction ds can be miniaturized.

Thereby, while disposing the light emitting thyristers 1LT of the same function and quantity with those in Patent Document 1, the light emitting element chip 42 can reduce its area. As a result, the light emitting element chip 42 can increase the quantity that can be manufactured from one piece of semiconductor wafer (so-called yield), enhancing its manufacturing efficiency.

Also, as mentioned above, the cathode electrode 70K is formed wider than the gate electrode 70G in the main scanning direction dm. On the other hand, the light emitting element chip 42 disposes two gate electrodes 70G1 and 70G2 together at an inter-region between the light emitting thyristers 1LT1 and 1LT2, and also disposes one cathode electrode 70K that is wider than the gate electrode 70G in the main scanning direction dm between the light emitting thyristers 1LT2 and 1LT3.

In this manner, the light emitting element chip 42 disposes two gate electrodes 70G that is narrow in the main scanning direction dm together between the light emitting thyristers 1LT, and also disposes one cathode electrode 70K that is wide in the main scanning direction dm at an inter-region between the light emitting thyristers 1LT. Thereby, presuming that the multiple light emitting thyristers 1LT are disposed with equal intervals along the main scanning direction dm, the light emitting element chip 42 can arrange efficiently the gate electrodes 70G and the cathode electrodes 70K in the main scanning direction dm with their positions in the sub scanning direction ds matched with those of the light emitting thyristers 1LT.

According to the above-mentioned configuration, on the light emitting element chip 42, the light emitting thyrister 1LT1 (in-pair first light emitting thyrister 1LTa), the light emitting thyrister 1LT2 (in-pair second light emitting thyrister 1LTb) disposed at a prescribed distance from the light emitting thyrister 1LT1 in the main scanning direction dm as a first direction, the anode electrode 70A1 corresponding to the light emitting thyrister 1LT1, the anode electrode 70A2 corresponding to the light emitting thyrister 1LT2, the gate electrode 70G1 corresponding to the light emitting thyrister 1LT1, the gate electrode 70G2 corresponding to the light emitting thyrister 1LT2, and the cathode electrode 70K corresponding to the light emitting thyristers 1LT1 and 1LT2 are installed, and the gate electrodes 70G1 and 70G2 are disposed at the inter-region between the light emitting thyristers 1LT1 and 1LT2.

Thereby, the light emitting element chip 42 can dispose the gate electrodes 70G1 and 70G2 together with the light emitting thyristers 1LT1 and 1LT2 along the main scanning direction dm, and match the positions of the gate electrodes 70G1 and 70G2 in the sub scanning direction ds with those of the light emitting thyristers 1LT1 and 1LT2.

2. Second Embodiment

[2-1. Configurations of the Image Forming Apparatus and the Print Head]

Although an image forming apparatus 101 (FIG. 1) by the second embodiment is different from the image forming apparatus 1 by the first embodiment in having a print head 133 in lieu of the print head 33 (FIG. 2), it is configured in the same manner in other respects. Although the print head 133 (FIG. 3) is different from the print head 33 by the first embodiment in having a light emitting element chip 142 in lieu of the light emitting element chip 42, it is configured in the same manner in other respects.

[2-2. Configuration of the Light Emitting Element Chip]

Although the light emitting element chip 142 (FIG. 9) is different from the light emitting element chip 42 by the first embodiment in having light emitting thyrister pairs 101LTS of a light emitting thyrister array 101LTA comprising light emitting thyristers 101LT1, 101LT2, 101LT3, 101LT4, . . . , and 101LTk in lieu of the light emitting thyrister pairs 1LTS of the light emitting thyrister array 1LTA comprising the light emitting thyristers 1LT1, 1LT2, 1LT3, 1LT4, . . . , 1LTk, it is configured in the same manner in other respects. Although the light emitting thyrister pair 101LTS is different from the light emitting thyrister pair 1LTS by the first embodiment in having an in-pair first light emitting thyrister 101LTa and an in-pair second light emitting thyrister 101LTb in lieu of the in-pair first light emitting thyrister 1LTa and the in-pair second light emitting thyrister 1LTb, it is configured in the same manner in other respects. Also, although the light emitting thyrister pair 101LTS is different from the light emitting thyrister pair 1LTS by the first embodiment in having a gate electrode formation region pair 164S in lieu of the gate electrode formation region pair 64S, it is configured in the same manner in other respects.

Compared with the gate electrode formation region pair 64S, the gate electrode formation region pair 164S has a different shape of the gate electrode formation region 164 (an in-pair first gate electrode formation region 164a and an in-pair second electrode formation region 164b) from the gate electrode formation region 64 (the in-pair first gate electrode formation region 64a and the in-pair second gate electrode formation region 64b). Note that in FIG. 9, only the surrounding area of the light emitting thyrister array 101LTA is shown, and the gate lead-out wiring 71G etc. are not shown but omitted.

Figure 9:
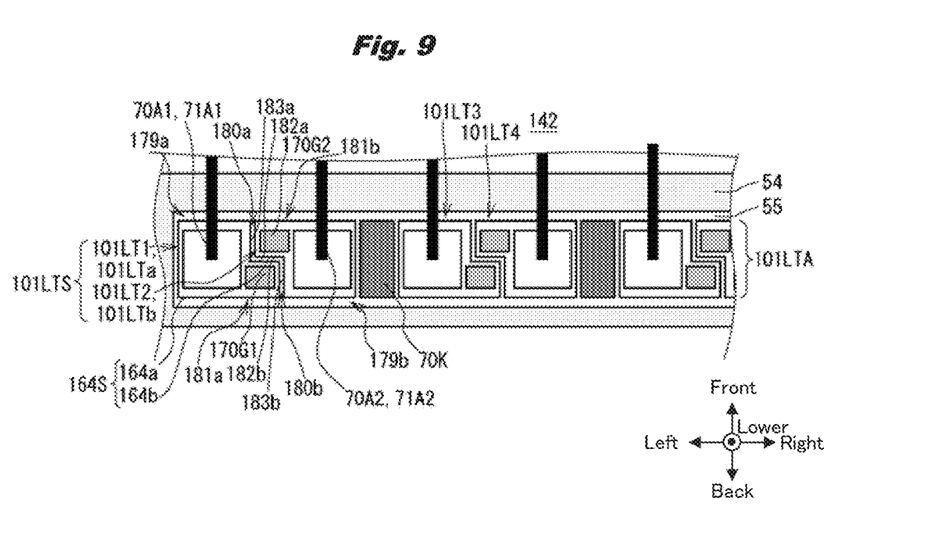
FIG. 9 is a bottom view showing the configuration of a light emitting element chip by the second embodiment.

Compared with the in-pair first gate electrode formation region 64a, the in-pair first gate electrode formation region 164a has a recess part 180a formed by shaving an approximate square shape on one side (front side) in the sub scanning direction ds at one end (right side) in the main scanning direction dm that is a place opposing the in-pair second gate electrode formation region 164b. Therefore, the in-pair first gate electrode formation region 164a has, on the other side (back side) in the sub scanning direction ds in the right side opposing the in-pair second gate electrode formation region 164b, a protruding part 181a formed in an approximate square shape protruding toward the in-pair second gate electrode formation region 164b from the main body part 179a having an approximate square shape.

The protruding part 181a of the in-pair first gate electrode formation region 164a and a protruding part 181b of the in-pair second gate electrode formation region 164*b* that is adjacent to the in-pair first gate electrode formation region 164*a* in the main scanning direction dm are adjacent to each other along the sub scanning direction. A protruding part's adjacent side 182*a* of the protruding part 181*a* that is a side opposing the protruding part 181*b* in the sub scanning direction ds is perpendicular to a main body protruding part's adjacent side 183*a* of the main body part 179*a* that is a side opposing the protruding part 181*b*, and is parallel to the main scanning direction dm. Thereby, the in-pair first gate electrode formation region 164*a* as a whole has a hexagonal shape with six sides, five corners of 90 degrees in exterior angle, and one corner of −90 degrees in exterior angle. A gate electrode 170G1 formed in the in-pair first gate electrode formation region 164*a* has its part corresponding to the recess part 180*a* shaved to become shorter than the gate electrode 70G1 in the sub scanning direction ds, becoming a rectangular shape that is longer in the sub scanning direction ds than in the main scanning direction dm in the bottom view.

The in-pair second gate electrode formation region 164*b* as a whole has a shape of the in-pair first gate electrode formation region 164*a* rotated by 180 degrees in the bottom view, and has a main body part 179*b*, a recess part 180*b*, and a protruding part 181*b* formed. A protruding part's adjacent side 182*b* of the protruding part 181*b* that is a side opposing the protruding part 181*a* in the sub scanning direction ds is perpendicular to a main body protruding part's adjacent side 183*b* of the main body part 179*b* that is a side opposing the protruding part 181*a* in the main scanning direction dm, and is parallel to the main scanning direction dm. Hereafter, the main body parts 179*a* and 179*b* are also collectively called the main body part 179, the recess parts 180*a* and 180*b* are also collectively called the recess part 180, the protruding parts 181*a* and 181*b* are also collectively called the protruding part 181, the protruding part's adjacent sides 182*a* and 182*b* are also collectively called the protruding part's adjacent side 182, and the main body protruding part's adjacent sides 183*a* and 183*b* are also collectively called the main body protruding part's adjacent side 183.

The in-pair first gate electrode formation region 164*a* and the in-pair second gate electrode formation region 164*b* are disposed so as to insert the protruding part 181*b* to the recess part 180*a* and the protruding part 181*a* to the recess part 180*b*, that is, one's protruding part 181 to the other's recess part 180. Thereby, the in-pair first gate electrode formation region 164*a* and the in-pair second gate electrode formation region 164*b* become an approximate rectangular shape as a whole when combined.

In such a configuration, the light emitting element chip 142 performs the same operations as those of the light emitting element chip 42. Also, this light emitting element chip 142 is manufactured by the same manufacturing method as that of the light emitting element chip 42.

In this manner, the print head 133 had the in-pair first gate electrode formation region 164*a* and the in-pair second gate electrode formation region 164*b* form the recess parts 180 and the protruding parts 181 along the main scanning direction dm, and dispose one's protruding part 181 inserted to the other's recess part 180. Therefore, even if the light emitting parts interval that is the interval of the multiple light emitting thyristers 101LT in the main scanning direction dm becomes smaller than the print head 33, the print head 133 can secure a region to make the gate electrode 170G1 contact with the gate lead-out wiring 71G (FIG. 5). Thereby, the print head 133 can realize a higher-resolution light emitting thyrister array 101LTA than the print head 33.

Also, the print head 133 made the in-pair first gate electrode formation region 164*a* and the in-pair second gate electrode formation region 164*b* in the same shape but rotated by 180 degrees. Thereby, the print head 133 can match the electrical characteristics of the in-pair first gate electrode formation region 164*a* and the in-pair second gate electrode formation region 164*b*.

Also, the print head 133 made the gate electrode formation region 164 in a simple rectangular shape in the bottom view. Thereby, the print head 133 can facilitate designing the pattern of the gate electrode formation region 164 and reduce the manufacturing difficulty.

In other respects, the print head 133 by the second embodiment can perform the same actions and effects as those of the print head 33 by the first embodiment.

3. Third Embodiment

[3-1. Configuration of the Image Forming Apparatus and the Print Head]

Although an image forming apparatus 201 (FIG. 1) by the third embodiment is different from the image forming apparatus 101 by the second embodiment in having a print head 233 in lieu of the print head 133 (FIG. 2), it is configured in the same manner in other respects. Although the print head 233 (FIG. 3) is different from the print head 133 by the second embodiment in having a light emitting element chip 242 in lieu of the light emitting element chip 142, it is configured in the same manner in other respects.

[3-2. Configuration of the Light Emitting Element Chip]

Although the light emitting element chip 242 (FIGS. 10A and 10B) is different from the light emitting element chip 142 by the second embodiment in having light emitting thyrister pairs 201LTS of a light emitting thyrister array 201LTA comprising light emitting thyristers 201LT1, 201LT2, 201LT3, 201LT4, ..., 201LTk in lieu of the light emitting thyrister pairs 101LTS of the light emitting thyrister array 101LTA comprising the light emitting thyristers 101LT1, 101LT2, 101LT3, 101LT4, ..., 101LTk, it is configured in the same manner in other respects. Although the light emitting thyrister pair 201LTS is different from the light emitting thyrister pair 101LTS by the second embodiment in having an in-pair first light emitting thyrister 201LTa and an in-pair second light emitting thyrister 201LTb in lieu of the in-pair first light emitting thyrister 101LTa and the in-pair second light emitting thyrister 101LTb, it is configured in the same manner in other respects. Also, although the light emitting thyrister pair 201LTS is different from the light emitting thyrister pair 101LTS by the second embodiment in having a gate electrode formation region pair 264S in lieu of the gate electrode formation region pair 164S, it is configured in the same manner in other respects.

Compared with the gate electrode formation region pair 164S, the gate electrode formation region pair 264S has a different shape of the gate electrode formation region 264 (an in-pair first gate electrode formation region 264*a* and an in-pair second electrode formation region 264*b*) from that of the gate electrode formation region 164 (the in-pair first gate electrode formation region 164*a* and the in-pair second gate electrode formation region 164*b*). Note that in FIGS. 10A and 10B, only the surrounding area of the light emitting thyrister array 201LTA is shown, and the gate lead-out wiring 71G etc. are not shown but omitted.

Figure 10A:
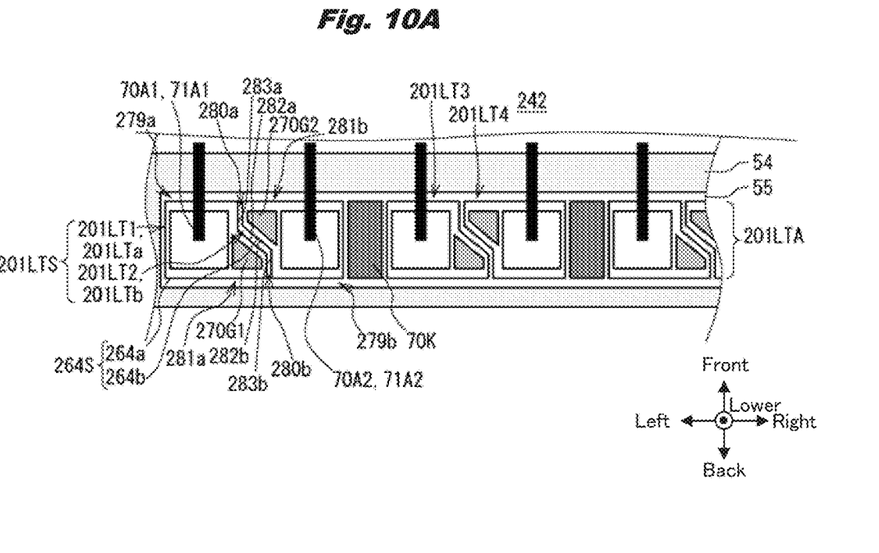
FIG. 10A is a bottom view.

Compared with the in-pair first gate electrode formation region 164*a*, the in-pair first gate electrode formation region 264*a* has a different shape of a recess part 280*a* from that of the recess part 180*a*, and a different shape of a protruding part 281*a* from that of the protruding part 181*a*. The protruding part 281*a* as a whole has a quadrilateral shape with a side adjacent to the in-pair second gate electrode formation region 264*b* in the main scanning direction dm shorter than a side away from the in-pair second gate electrode formation region 264*b* in the main scanning direction dm.

The protruding part's adjacent side 282*a* of the protruding part 281*a* that is a side opposing the protruding part 281*b* in the sub scanning direction ds has an exterior angle of about −45 degrees relative to the main body protruding part's adjacent side 283*a* of the main body 279*a* that is a side opposing the protruding part 281*b* in the main scanning direction dm, and is inclined relative to the main scanning direction dm. Thereby, the in-pair first gate electrode formation region 264*a* as a whole has a hexagonal shape with six sides, four corners of 90 degrees in exterior angle, one corner of 45 degrees in exterior angle, and one corner of −45 degrees in exterior angle.

Figure 10B:
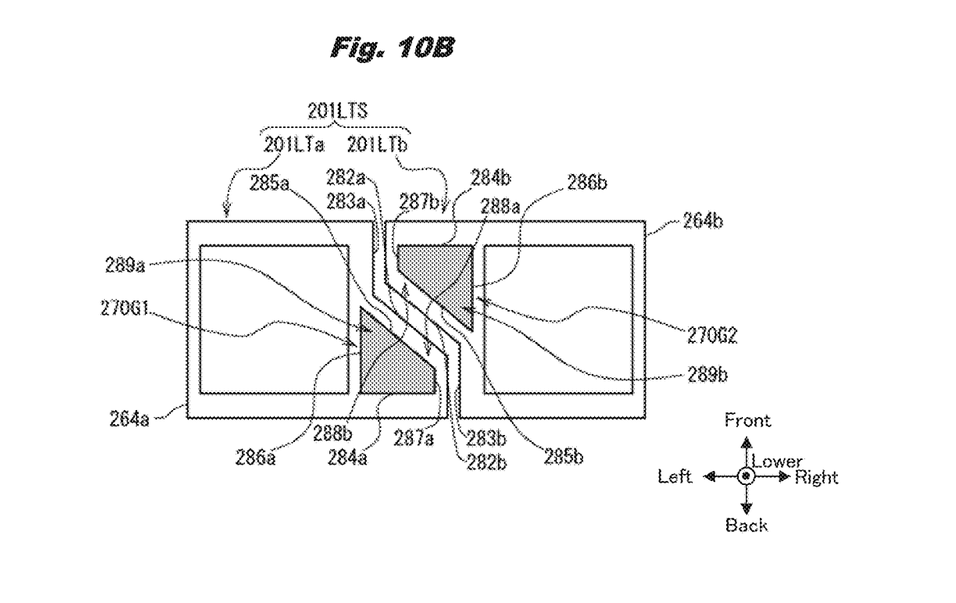
FIG. 10B is an enlarged view.

Also, as shown in FIG. 10B, a gate electrode 270G1 formed in the in-pair first gate electrode formation region 264*a* has an electrode main scanning direction first side 284*a* that is away from a gate electrode 270G2 formed in the in-pair second gate electrode formation region 264*b* in the sub scanning direction ds and is along the main scanning direction dm, an electrode main scanning direction second side 285*a* that opposes the electrode main scanning direction first side 284*a* and is inclined relative to the main scanning direction dm, an electrode sub scanning direction first side 286*a* that is away from the gate electrode 270G2 in the main scanning direction dm and is along the sub scanning direction ds, and an electrode sub scanning direction second side 287*a* that opposes the electrode sub scanning direction first side 286*a* and is along the sub scanning direction ds formed. The gate electrode 270G1 has the electrode sub scanning direction first side 286*a* made longer than that of the gate electrode 170G1 and is in a quadrilateral shape. Also, the gate electrode 270G1 has, among its four sides, the electrode main scanning direction first side 284*a* that is one side along the main scanning direction dm and the electrode sub scanning direction first side 286*a* that is one side along the sub scanning direction ds given the same length.

Also, on its left end side that is one end in the main scanning direction dm, the gate electrode 270G1 has an electrode protruding part 289*a* formed protruding in the sub scanning direction ds toward the gate electrode 270G2. Therefore, on its right end side that is the other end in the main scanning direction dm, the gate electrode 270G1 has an electrode recess part 288*a* formed that is farther away from the gate electrode 270G2 than the electrode protruding part 289*a* in the sub scanning direction ds. The gate electrodes 270G1 and 270G2 are disposed so as to insert the electrode protruding part 289*b* to the electrode recess part 288*a* and the electrode protruding part 289*a* to the electrode recess part 288*b*, that is, to insert one's electrode protruding part 289 to the other's electrode recess part 288.

The in-pair second gate electrode formation region 264*b* as a whole has the shape of the in-pair first gate electrode formation region 264*a* rotated by 180 degrees in the bottom view, and has a main body part 279*b*, a recess part 280*b*, and the protruding part 281*b* formed. Hereafter, the main body parts 279*a* and 279*b* are also collectively called the main body part 279, the recess parts 280*a* and 280*b* are also collectively called the recess part 280, the protruding parts 281*a* and 281*b* are also collectively called the protruding part 281, the protruding part's adjacent sides 282*a* and 282*b* are also collectively called the protruding part's adjacent side 282, and the main body protruding part's adjacent sides 283*a* and 283*b* are also collectively called the main body protruding part's adjacent side 283. The gate electrode 270G2 as a whole also has the shape of the gate electrode 270G1 rotated by 180 degrees in the bottom view, and has the electrode protruding part 289*b* and the electrode recess part 288*a* formed. Hereafter, the electrode main scanning direction first sides 284*a* and 284*b* are also collectively called the electrode main scanning direction first side 284, the electrode main scanning direction second sides 285*a* and 285*b* are also collectively called the electrode main scanning direction second side 285, the electrode sub scanning direction first sides 286*a* and 286*b* are also collectively called the electrode sub scanning direction first side 286, the electrode sub scanning direction second sides 287*a* and 287*b* are also collectively called the electrode sub scanning direction second side 287, the electrode recess parts 288*a* and 288*b* are also collectively called the electrode recess part 288, and the electrode protruding parts 289*a* and 289*b* are also collectively called the electrode protruding part 289.

The in-pair first gate electrode formation region 264*a* and the in-pair second gate electrode formation region 264*b* are disposed so as to insert the protruding part 281*b* to the recess part 280*a* and the protruding part 281*a* to the recess part 280*b*, that is, one's protruding part 281 to the other's recess part 280. Thereby, the in-pair first gate electrode formation region 264*a* and the in-pair second gate electrode formation region 264*b* become an approximate rectangular shape as a whole when combined.

In such a configuration, the light emitting element chip 242 performs the same operations as those of the light emitting element chip 142. Also, this light emitting element chip 242 is manufactured by the same manufacturing method as that of the light emitting element chip 142.

By the way, in the manufacturing process of the light emitting element chip 242, the minimum lengths of the sides along the main scanning direction dm and the sides along the sub scanning direction ds of the gate electrode 270G are determined by the performance of an exposure machine. Therefore, among its four sides, the gate electrode 270G needs to have at least one side along the main scanning direction dm and at least one side along the sub scanning direction ds satisfy regulated lengths.

On the other hand, the print head 233 had the protruding part's adjacent side 282*a* of the in-pair first gate electrode formation region 264*a* and the protruding part's adjacent side 282*b* of the in-pair second gate electrode formation region 264*b*, that is adjacent to and opposes the protruding part's adjacent side 282*a* in the sub scanning direction ds, inclined relative to the main scanning direction dm. Also, the print head 233 had the gate electrodes 270G1 and 270G2 oppose each other in the sub scanning direction ds and form the electrode recess part 288 and the electrode protruding part 289, and disposed them so as to insert one's electrode protruding part 289 to the other's electrode recess part 288. Furthermore, the print head 233 had the electrode main scanning direction first side 284 satisfy a regulated length in the main scanning direction dm, and the electrode sub scanning direction first side 286 satisfy a regulated length in the sub scanning direction ds.

Therefore, while satisfying the minimum lengths of the sides along the main scanning direction dm and the sides along the sub scanning direction ds due to the performance of the exposure machine in forming the gate electrode 270G in the manufacturing process, the print head 233 can dispose the in-pair first gate electrode formation region 264*a* and the in-pair second gate electrode formation region 264*b* with high density in the sub scanning direction, and thus reduce the width of the light emitting element chip 242 in the sub scanning direction ds.

In other respects also, the print head 233 by the third embodiment can perform the same actions and effects as those of the print head 133 by the second embodiment.

4. Other Embodiments

Note that stated in the above-mentioned first embodiment was a case where the cathode electrode 70K was disposed between the adjacent light emitting thyristor pairs 1LTS. This invention is not limited to this, but the cathode electrode can be disposed in various kinds of positions. In that case for example, four light emitting thyristors 1LT connected to one anode pad 66A can be regarded as one set of light emitting thyristors, and a cathode electrode can be formed only between the adjacent light emitting thyristor sets. Also, without disposing any cathode electrode between the light emitting thyristor sets, only a cathode electrode positioned in the center of the light emitting thyristor set in the main scanning direction dm can be disposed. Essentially for example, every other cathode electrodes 70K along the main scanning direction dm on the light emitting element chip 42 can be eliminated. In that case, it is preferred to adjust the thickness of the N-type layer 56 as appropriate. The same also applies to the second and third embodiments.

Also, stated in the above-mentioned first embodiment was a case where the cathode electrode 70K was formed on the N-type layer 56. This invention is not limited to this, but the cathode electrode can be formed under the N-type layer 56 or the flattening film 54, a hole part can be formed on the N-type layer 56 or the flattening film 54, and the cathode electrode can be led out to the surface of the N-type layer 56 through the hole part. The same also applies to the second and third embodiments.

Furthermore, stated in the above-mentioned second embodiment was a case where the in-pair first gate electrode formation region 164a and the in-pair second gate electrode formation region 164b were made in hexagonal shapes. This invention is not limited to this, but they can be made in various kinds of shapes. Essentially, the shapes only need to be such that the end part on one way in the main scanning direction dm of the in-pair gate electrode formation region 164a enters more on the one way in the main scanning direction dm than the end part on the other way in the main scanning direction dm of the in-pair second gate electrode formation region 164b. The same also applies to the third embodiment.

Furthermore, stated in the above-mentioned first embodiment was a case where the light emitting thyristor 1LT was used as a three-terminal light emitting element. This invention is not limited to this, but a transistor can be used as a three-terminal light emitting element. In that case, a collector electrode, a base electrode, and an emitter electrode in the transistor correspond to the anode electrode, the gate electrode, and the cathode electrode in the light emitting thyristor 1LT, respectively. The same also applies to the second and third embodiments.

Furthermore, stated in the above-mentioned first embodiment was a case where the light emitting thyristor 1LT was configured as a wafer having a four-layer structure of "PNPN" from the upper side, forming the cathode electrode 70K on the N-type layer 56, the gate electrode 70G on the N-type layer 58, and the anode electrode 70A on the P-type layer 59. This invention is not limited to this, but the light emitting thyristor 1LT can be configured as a wafer having a four-layer structure of "NPNP" from the upper side, switching the anode electrode, and the cathode electrode and forming the cathode electrode on the top N-type layer, the gate electrode on the P-type layer below the N-type layer, and the anode electrode on the bottom P-type layer.

Furthermore, stated in the above-mentioned first embodiment was a case where the light emitting thyristor 1LT, having so-called the "PNPN-type" configuration where a P-type semiconductor, an N-type semiconductor, a P-type semiconductor, and an N-type semiconductor were sequentially bonded, was made the driven element that was driven by the driver IC. This invention is not limited to this, but various kinds of light emitting thyristors having a PN bonding such as a light emitting thyristor having the "PNPNPN-type" configuration where a P-type semiconductor, an N-type semiconductor, a P-type semiconductor, an N-type semiconductor, a P-type semiconductor, and an N-type semiconductor are sequentially bonded, can be made the driven element for example. The same also applies to the second and third embodiments.

Furthermore, stated in the above-mentioned first embodiment was a case where the light emitting thyristor 1LT was given a structure where a AlGaAs layer was formed on a GaAs wafer. This invention is not limited to this, but it can also use another material such as GaP, GaAsP, or AlGaInP for example, and also a film of a material such as GaN, AlGaN, or InGaN can be formed on a sapphire substrate.

Furthermore, stated in the above-mentioned first embodiment was a case where this invention was applied to the image forming apparatus 1 consisting of an MFP. However, this invention is not limited to this but can be applied to various kinds of electronic equipment such as a copier and a facsimile machine that have a function to form a toner image by the electrophotographic method and fuses it on a sheet. The same also applies to the second and third embodiments.

Furthermore, this invention is not limited to the above-mentioned embodiments and other embodiments. That is, the scope of application of this invention also includes embodiments that arbitrarily combine the above-mentioned embodiments and part or the whole of the above-mentioned other embodiments and embodiments that extracted part of them.

Furthermore, stated in the above-mentioned first embodiment was a case where the light emitting element chip 42 as a semiconductor device was configured of the light emitting thyristor 1LT1 (in-pair first light emitting thyristor 1LTa) as a first three-terminal light emitting element, the light emitting thyristor 1LT2 (in-pair second light emitting thyristor 1LTb) as a second three-terminal light emitting element, the anode electrode 70A1 as a first current supply electrode, the anode electrode 70A2 as a second current supply electrode, the gate electrode 70G1 as a first control electrode, the gate electrode 70G2 as a second control electrode, and the cathode electrode 70K as a current extraction electrode. However, this invention is not limited to this, but the semiconductor device can be configured of a first three-terminal light emitting element, a second three-terminal light emitting element, a first current supply electrode, a second current supply electrode, a first control electrode, a second control electrode, and a current extraction electrode of various kinds of other configurations.

In the above embodiment, gate electrodes (70G1, 170G1 and 270G1) as the first control electrodes are formed on a flat plane (first surface). Gate electrodes (70G2, 170G2, 270G2) as the second control electrodes are also formed on a flat plane (second surface). The first surface and the second surface are disposed on the same plane. Namely, these first and second gate electrodes are formed on the same plane. In a plan view, one outer edge of the first control electrodes is arranged parallel to one outer edge of the second control electrode. These outer edges are opposing each other such that the interval between these edges is the minimal distance between these electrodes. FIG. 5 illustrates that these outer edges of gate electrodes 70G1 and 70G2 are linear extending in the front-back direction. FIG. 9 illustrates that these outer edges of gate electrodes 170G1 and 170G2 are linear extending in the left-right direction. FIG. 10B illustrates that these outer edges of gate electrodes 270G1 and 270G2 are linear extending in a diagonal direction that is oriented from the upper left to the lower right in the drawing. In FIG. 5, these electrodes are in a rectangle shape and line symmetric. In FIG. 9, these electrodes are in a rectangle shape and point symmetric. In FIG. 10B, these electrodes are in a trapezoid shape and point symmetric.

This invention can be utilized by an MFP that performs printing by forming a toner image by the electrophotographic method and fuses it on a sheet for example.

What is claimed is:

1. A semiconductor device, comprising:
   a first three-terminal light emitting element,
   a second three-terminal light emitting element that is disposed at a prescribed distance away from the first three-terminal light emitting element in a first direction,
   a first current supply electrode that corresponds to the first three-terminal light emitting element,
   a second current supply electrode that corresponds to the second three-terminal light emitting element,
   a first control electrode that corresponds to the first three-terminal light emitting element,
   a second control electrode that corresponds to the second three-terminal light emitting element, and
   a current extraction electrode that corresponds to the first three-terminal light emitting element and the second three-terminal light emitting element, wherein
   the first control electrode and the second control electrode are disposed at an inter-region that is determined between the first three-terminal light emitting element and the second three-terminal light emitting element.

2. The semiconductor device according to claim 1, further comprising:
   a third three-terminal light emitting element that is disposed at a prescribed distance away from the second three-terminal light emitting element in the first direction, wherein
   the current extraction electrode is disposed at an inter-region that is determined between the second three-terminal light emitting element and the third three-terminal light emitting element.

3. The semiconductor device according to claim 2, wherein
   the first control electrode and the second control electrode are disposed opposing each other along the first direction.

4. The semiconductor device according to claim 2, wherein
   the first three-terminal light emitting element, the second three-terminal light emitting element, and the third three-terminal light emitting element are arranged with approximately a uniform interval in the first direction.

5. The semiconductor device according to claim 2, wherein
   the current extraction electrode is formed in a common layer that commonly connects the first three-terminal light emitting element and the second three-terminal light emitting element, and its wiring extends toward one way in a second direction perpendicular to the first direction,
   the first control electrode is formed in a control electrode formation layer that overlaps with the common layer, and its wiring extends toward the same way as the one way in the second direction, and
   the first current supply electrode is formed in a current supply electrode formation layer that overlaps with the control electrode formation layer, and its wiring extends the other way, which is 180 degrees opposite to the one way in the second direction.

6. The semiconductor device according to claim 2, wherein
   the first three-terminal light emitting element, the second three-terminal light emitting element, and the third three-terminal light emitting element are formed of semiconductor thin films, and the semiconductor thin films are bonded to the surface of a substrate.

7. The semiconductor device according to claim 6, wherein
   a first control electrode formation region where the first control electrode is formed and a second control electrode formation region where the second control electrode is formed are both in rectangular shapes in a front view of the substrate.

8. The semiconductor device according to claim 6, wherein
   a first control electrode formation region where the first control electrode is formed has a recess part that is in a recess shape and a protruding part that is in a protruding shape,
   a second control electrode formation region where the second control electrode is formed has a recess part that is in a recess shape and a protruding part that is in a protruding shape,
   the first control electrode and the second control electrode are arranged such that the protruding part of the first control electrode formation region is inserted to the recess part of the second control electrode formation region, and the protruding part of the second control electrode formation region is inserted to the recess part of the first control electrode formation region.

9. The semiconductor device according to claim 8, wherein
   the first control electrode formation region and the second control electrode formation region are in hexagonal shapes.

10. The semiconductor device according to claim 9, wherein
    the first control electrode formation region and the second control electrode formation region have two sides,
    these sides oppose each other in a second direction which is perpendicular to the first direction, and
    these sides are arranged along the first direction.

11. The semiconductor device according to claim 9, wherein
    the first control electrode formation region and the second control electrode formation region have two sides,
    these sides oppose each other in a second direction which is perpendicular to the first direction, and
    these sides incline relative to the first direction.

12. The semiconductor device according to claim 1, wherein
the first three-terminal light emitting element and the second three-terminal light emitting element are thyristors.

13. The semiconductor device according to claim 12, wherein
the first current supply electrode and the second current supply electrode are anode electrodes,
the first control electrode and the second control electrode are gate electrodes, and
the current extraction electrode is a cathode electrode.

14. The semiconductor device according to claim 1, wherein
the first three-terminal light emitting element and the second three-terminal light emitting element are transistors.

15. The semiconductor device according to claim 14, wherein
the first current supply electrode and the second current supply electrode are collector electrodes,
the first control electrode and the second control electrode are base electrodes, and
the current extraction electrode is an emitter electrode.

16. A print head, comprising:
multiple of the semiconductor devices according to claim 1, and
a substrate to which multiple of the semiconductor devices are attached in a state where the semiconductor devices are arranged along the first direction.

17. An image forming apparatus, comprising:
an image forming part that generates an electrostatic latent image by exposing a photosensitive body by the print head according to claim 16 and forms an image based on the electrostatic latent image with a developer, and
a fuser part that fuses the image to a prescribed medium.

* * * * *